United States Patent
Fujisawa et al.

(10) Patent No.: US 11,537,536 B2
(45) Date of Patent: *Dec. 27, 2022

(54) MEMORY CONTROLLER CONFIGURED TO TRANSMIT INTERRUPT SIGNAL IF VOLATILE MEMORY HAS NO DATA CORRESPONDING TO ADDRESS REQUESTED FROM SOURCE

(71) Applicant: Kioxia Corporation, Tokyo (JP)

(72) Inventors: Toshio Fujisawa, Yokohama Kanagawa (JP); Nobuhiro Kondo, Yokohama Kanagawa (JP); Shoji Sawamura, Yokohama Kanagawa (JP); Kenichi Maeda, Kamakura Kanagawa (JP); Atsushi Kunimatsu, Funabashi Chiba (JP)

(73) Assignee: Kioxia Corporation, Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 17/155,415

(22) Filed: Jan. 22, 2021

(65) Prior Publication Data

US 2021/0141746 A1   May 13, 2021

Related U.S. Application Data

(63) Continuation of application No. 16/023,458, filed on Jun. 29, 2018, now Pat. No. 10,929,315, which is a (Continued)

(30) Foreign Application Priority Data

Mar. 10, 2015   (JP) .................. 2015-047251

(51) Int. Cl.
*G06F 13/16* (2006.01)
*G06F 13/28* (2006.01)
(Continued)

(52) U.S. Cl.
CPC .......... *G06F 13/1668* (2013.01); *G06F 13/28* (2013.01); *G11C 11/005* (2013.01); *G11C 5/04* (2013.01)

(58) Field of Classification Search
CPC ....... G06F 13/1668; G06F 13/28; G11C 5/04; G11C 11/005
See application file for complete search history.

(56) References Cited

U.S. PATENT DOCUMENTS

| 5,239,646 A | 8/1993 | Kimura |
| 5,737,342 A | 4/1998 | Ziperovich |

(Continued)

FOREIGN PATENT DOCUMENTS

| JP | 2011-070470 A | 4/2011 |
| JP | 2014-078231 A | 5/2014 |

*Primary Examiner* — Tammara R Peyton
(74) *Attorney, Agent, or Firm* — Allen & Overy LLP

(57) ABSTRACT

According to one embodiment, a memory device includes a nonvolatile memory, a volatile memory, a controller, and a board. The nonvolatile memory stores data. The volatile memory holds a part of the data stored in the nonvolatile memory. The memory controller controls the volatile memory and the nonvolatile memory. The nonvolatile memory, the volatile memory, and the memory controller are provided on the board. The memory controller transmits an interrupt signal to a request source, when the volatile memory does not have any data corresponding to an address which the request source requests to access.

20 Claims, 5 Drawing Sheets

Related U.S. Application Data continuation of application No. 14/808,431, filed on Jul. 24, 2015, now Pat. No. 10,042,786.

(51) Int. Cl.
  *G11C 11/00* (2006.01)
  *G11C 5/04* (2006.01)

(56) References Cited

U.S. PATENT DOCUMENTS

| | | |
|---|---|---|
| 6,401,168 B1 | 6/2002 | Williams et al. |
| 7,266,664 B2 | 9/2007 | Higuchi et al. |
| 8,135,933 B2 | 3/2012 | Fisher et al. |
| 8,767,463 B2 | 7/2014 | Amidi et al. |
| 10,929,315 B2 * | 2/2021 | Fujisawa ............. G06F 13/1668 |
| 2009/0024819 A1 | 1/2009 | Fisher et al. |
| 2009/0235014 A1 | 9/2009 | Yim et al. |
| 2012/0173809 A1 | 7/2012 | Ko |
| 2013/0275682 A1 | 10/2013 | Ramanujan et al. |
| 2014/0101370 A1 | 4/2014 | Chu et al. |
| 2015/0309927 A1 | 10/2015 | Sinclair et al. |

\* cited by examiner

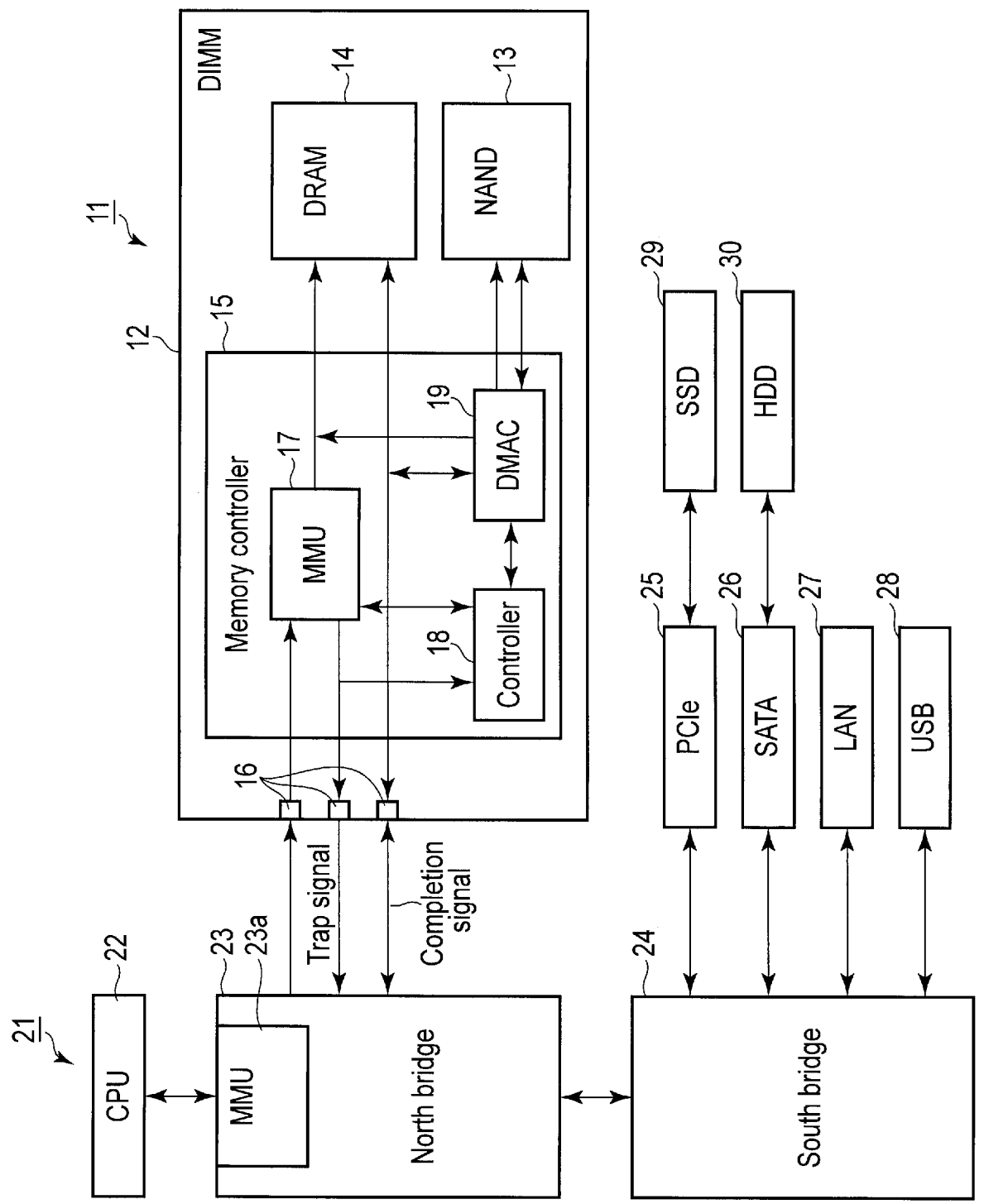
F I G. 1

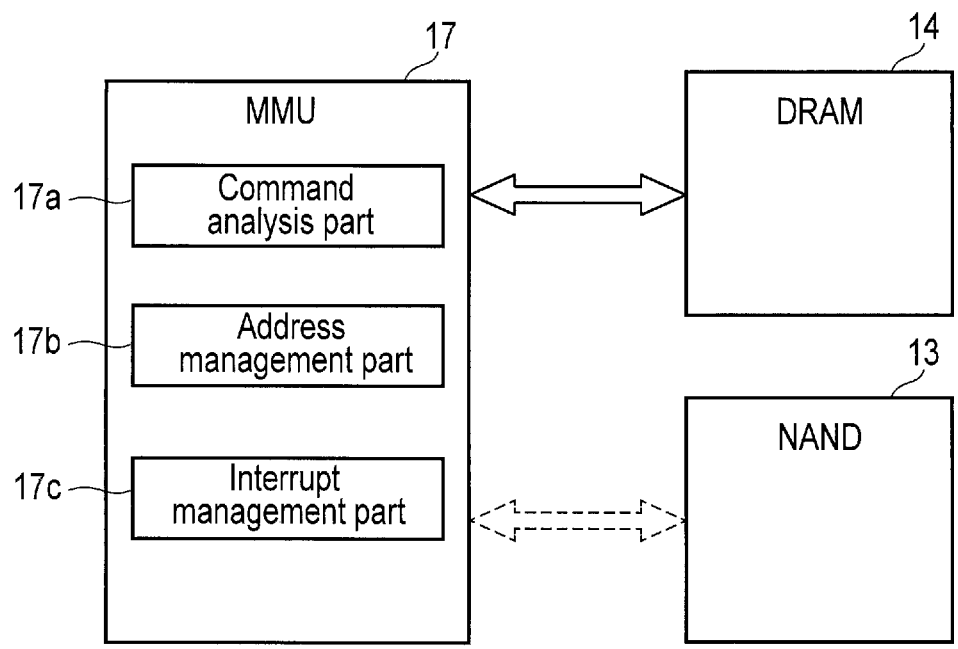
F I G. 3
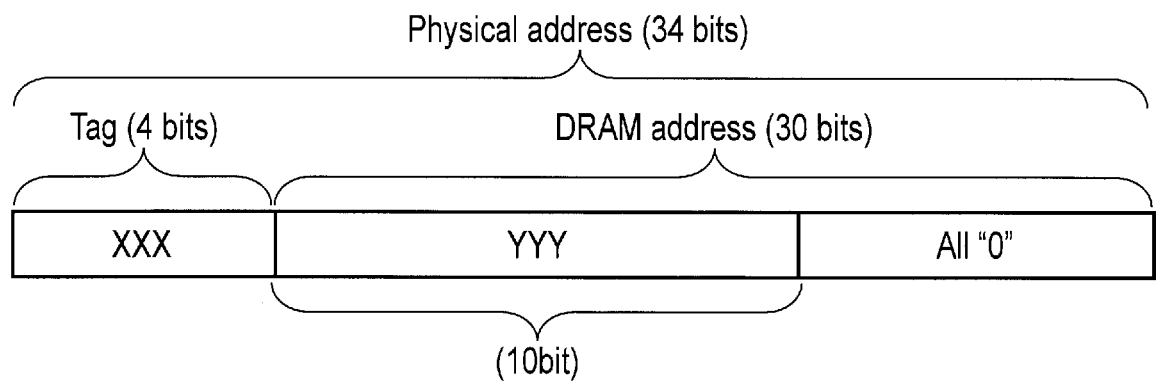
F I G. 4

MEMORY CONTROLLER CONFIGURED TO TRANSMIT INTERRUPT SIGNAL IF VOLATILE MEMORY HAS NO DATA CORRESPONDING TO ADDRESS REQUESTED FROM SOURCE

CROSS-REFERENCE TO RELATED APPLICATIONS

This application is a continuation of application Ser. No. 16/023,458 filed Jun. 29, 2018 which is a continuation of application Ser. No. 14/808,431 filed Jul. 24, 2015 (now U.S. Pat. No. 10,042,786) and is based upon and claims the benefit of priority from Japanese Patent Application No. 2015-047251, filed Mar. 10, 2015, the entire contents of which are incorporated herein by reference.

FIELD

Embodiments described herein relate generally to, for example, a memory device applied to a computer.

BACKGROUND

Recently, a dual in-line memory module (DIMM) which incorporates a volatile memory and a nonvolatile memory has been developed.

BRIEF DESCRIPTION OF THE DRAWINGS

FIG. 1 is a block diagram schematically illustrating an exemplary memory device in one embodiment;

FIG. 3 is a block diagram schematically illustrating the composition of a part of the memory device illustrated in FIG. 1;

FIG. 4 is a view illustrating an exemplary address;

DETAILED DESCRIPTION

Figure 2:
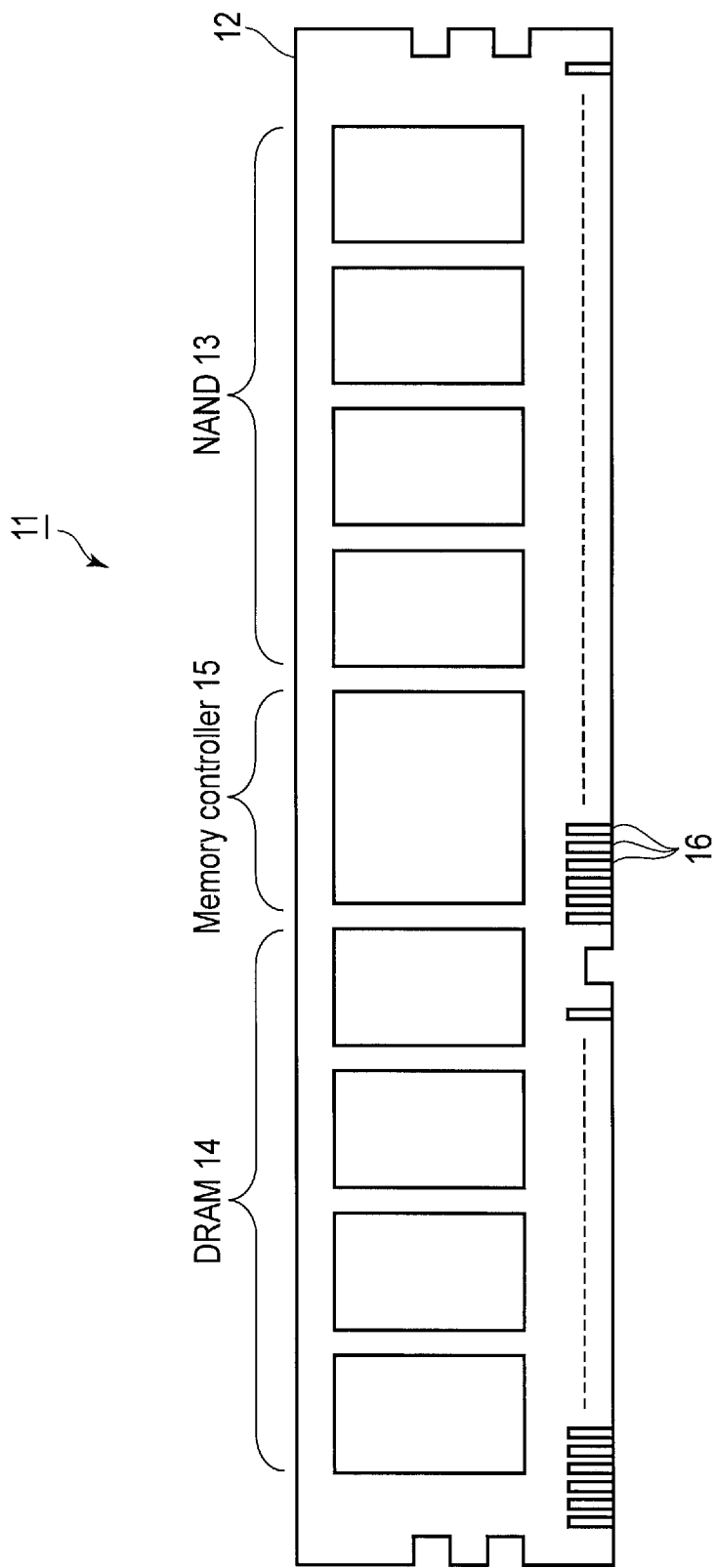
FIG. 2 is a plan view illustrating an exemplary mounting state of the memory device of the embodiment.

In general, according to one embodiment, a memory device includes a nonvolatile memory, a volatile memory, a controller, and a board. The nonvolatile memory stores data. The volatile memory holds a part of the data stored in the nonvolatile memory. The memory controller controls the volatile memory and the nonvolatile memory. The nonvolatile memory, the volatile memory, and the memory controller are provided on the board. The memory controller transmits an interrupt signal to a request source, when the volatile memory does not have any data corresponding to an address which the request source requests to access.

Hereafter, an embodiment will be described with reference to the drawings.

A typical computer has storage, including a main memory (DRAM) as a volatile memory, and a hard disk drive (HDD) or a solid-state drive (SSD) as a nonvolatile memory. The HDD or SSD is connected to a central processing unit (CPU) bus using an interface such as a Peripheral Component Interconnect Express (PCIe) interface, a Serial Advanced Technology Attachment (SATA) interface, etc. A program which the CPU executes needs to be held on the main memory. For this reason, the transfer of program code from the storage through the CPU bus to the main memory should frequently occur, which affects the performance of the computer. Therefore, improvement in the performance of a computer is desired.

FIG. 1 illustrates a memory device 11 in one embodiment. The memory device 11 is applied to a computer 21 as an information processing unit. The computer 21 includes a CPU 22, a north bridge 23 and a south bridge 24, for example. The north bridge 23 and south bridge 24 each function as an input/output interface of the CPU 22. The south bridge 24 is an interface handling comparatively low-speed data, and a PCIe interface 25, SATA interface 26, LAN 27, and USB 28 are connected to the south bridge 24, for example. Furthermore, a large-scale storage device, such as an SSD 29 or an HDD 30, is connected to the PCIe interface 25 or SATA interface 26, for example. The interface used for connection of the SSD 29 is not limited to the PCIe interface 25. Connection by the SATA interface 26 or a Serial Attached SCSI (SAS) interface, which is not illustrated in any of the drawings, is also possible. Moreover, the interface used for connection of the HDD 30 is not limited to the SATA interface 26. The connection using the PCIe interface 25 or SAS is also possible.

The north bridge 23 is an interface handling high-speed data. The memory device 11, a graphics board, which is not illustrated in any of the drawings, and so forth are connected to the north bridge 23.

The north bridge 23 has a memory management unit (MMU) 23a, for example. MMU 23a controls the memory device 11, SSD 29, and HDD 30 as virtual memories, for example, under an operating system. Furthermore, when MMU 23a receives a trap signal having been transmitted from the memory device 11 as an interrupt signal, MMU 23a does not have access to the SSD 29 or HDD 30, but notifies the CPU 22 of the reception of the trap signal, as will be described later. Concrete operation of the memory device 11, SSD 29, or HDD 30 will be described later.

The memory device 11 of this embodiment is mounted on a DIMM, for example. The memory device 11 includes a NAND flash memory (hereinafter referred to as NAND) 13 as a nonvolatile memory, a DRAM 14 as a volatile memory, a memory controller 15 which controls the DRAM 14 and NAND 13, and pins 16 as connection terminals connected to the memory controller 15.

A nonvolatile memory is not limited to the NAND 13, but a magneto-resistive RAM (MRAM) or a resistive RAM (ReRAM) may be used as a nonvolatile memory. The NAND 13 holds data read from the SSD 29 or HDD 30 as will be described later. The DRAM 14 holds a part of the data held in the NAND 13. In other words, the data held in the NAND 13 is partially copied to the DRAM 14. Accordingly, the DRAM 14 is smaller than the NAND 13 in storage capacity. For example, when the NAND 13 is 16 GB, the DRAM 14 may have a storage capacity of only 1 GB. However, how much storage capacity each memory has is not limited to the above example but is variable.

The memory controller 15 comprises a memory management unit (MMU) 17, a controller 18, and a direct-memory-access controller (DMAC) 19, for example. MMU 17 accesses the DRAM 14 based on the physical address supplied from the CPU 22, which will be described later. However, when there is no corresponding data in the physical address of the DRAM 14 indicated by the CPU 22, MMU 17 accesses the NAND 13 with the help of the controller 18 and DMAC 19. The data read from the NAND 13 by the DMAC 19 is transmitted through to the DRAM 14. The data transmitted to the DRAM 14 is further transmitted to the CPU 22 by the memory controller 15. For this reason, the CPU 22 can treat the memory device 11 as a DRAM which has a storage capacity of the NAND 13.

The DMAC 19 controls the direct-memory-access between the NAND 13 and DRAM 14 under the control of the controller 18.

The controller 18 controls the DMAC 19, etc., according to instructions from MMU 17.

FIG. 2 illustrates an exemplary mounting state of the memory device 11. The NAND 13, DRAM 14, and memory controller 15 are provided on the printed-circuit board (hereinafter referred to as a "board") 12 of the DIMM. The memory controller 15 is connected to some of the pins 16 provided on the board 12.

The memory device 11 is connected to the north bridge 23 when the pins 16 are inserted into the slots (not shown) and electrically connected to the north bridge 23.

The memory device 11 that is mounted on the DIMM has been described as an example of the present embodiment. However, the memory device 11 of this embodiment can be mounted not only on the DIMM but also can be mounted on any memory board other than the DIMM. Moreover, the memory device 11 of this embodiment does not need to be mounted on a board exclusively used for a memory, but may be mounted on a board or a semiconductor substrate on which other circuit elements are also mounted.

FIG. 3 illustrates an example of MMU 17. MMU 17 includes a command analysis part 17a, an address management part 17b, and an interrupt management part 17c, for example. The command analysis part 17a analyzes any command supplied from the CPU 22, for example, and controls the reading or writing of data to or from the DRAM 14.

The address management part 17b not only manages the addresses of the NAND 13 or DRAM 14, but also examines whether every data in the DRAM 14 is valid or invalid. Furthermore, whenever any data in the DRAM 14 is rewritten, the address management part 17b examines whether the rewritten data are surely reflected in the NAND 13.

When the DRAM 14 does not have any data corresponding to an address which the CPU 22 requests to access, the interrupt management part 17c generates a trap signal as an interrupt signal, and sends the trap signal to the CPU 22. Simultaneously, the interrupt management part 17c sends the trap signal to the controller 18, and requests the controller 18 to cause the DMAC 19 to read data from the NAND 13 and to transmit the data to the DRAM 14. Furthermore, when the data read from the NAND 13 has been transmitted to the DRAM 14 by the DMAC 19, the interrupt management part 17c generates a completion signal as an interrupt signal, and sends the completion signal to the CPU 22.

What the command analysis part 17a, the address management part 17b, and the interrupt management part 17c do are not limited to the above-mentioned respective functions but may be modified.

FIG. 4 illustrates an exemplary physical address supplied from the CPU 22. Let us suppose here that, as described above, the storage capacity of the NAND 13 should be 16 GB and the storage capacity of the DRAM 14 should be 1 GB. Moreover, let us suppose that the data held in the NAND 13 should be partially held in the DRAM 14 and that the CPU 22 should recognize the memory device 11 to be a 16-GB DRAM.

Under such an assumption, a 34-bit or more physical address is required in order to access the 16-GB memory device 11. For this reason, a 34-bit physical address such as illustrated in FIG. 4 will be supplied by the CPU 22. For instance, 30 bits from the least significant bit of the 34-bit address are assigned to be used as an address to access 1-GB DRAM 14. When a cache line size is supposed to be 1 MB, the lower 20 bits will be used as an address in a line, and the upper 10 bits will be used as an entry address. Moreover, the top 4 bits of the 34-bit address are assigned to a tag which is used as information to have access to 16 GB of the NAND 13 in units of 1 GB.

Figure 5:
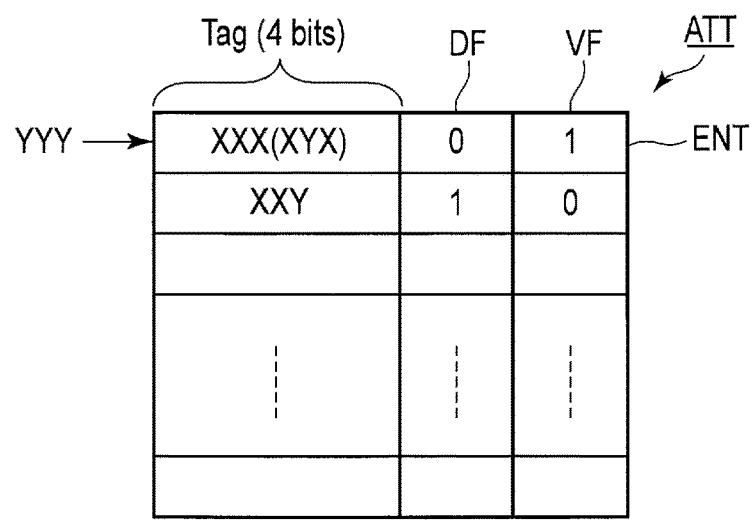
FIG. 5 is a view illustrating an exemplary address management table.

FIG. 5 illustrates an exemplary address translation table ATT provided in the address management part 17b. The address translation table ATT has entries ENT each specified by a 10-bit entry address. Each entry ENT comprises a 4-bit tag, a dirty flag DF, and a valid flag VF.

A physical address is specified with a 10-bit entry address (hereinafter referred to as YYY), and a 4-bit tag (hereinafter referred to as XXX).

Figure 6:
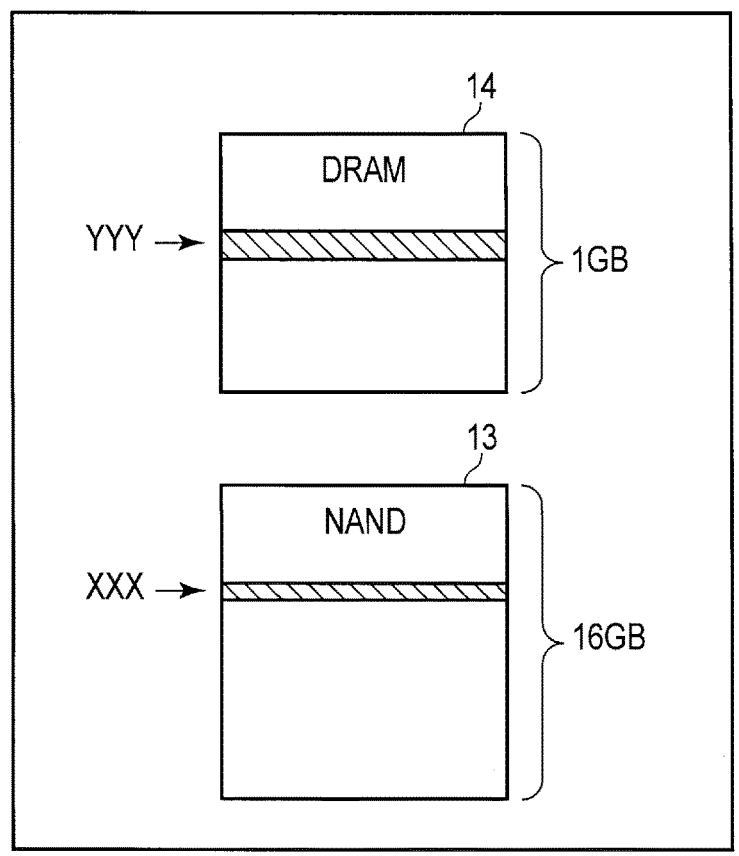
FIG. 6 is a view illustrating address relations in the memory device.

For example, when address YYY of the DRAM 14 such as illustrated in FIG. 6 is accessed, and when a physical address such as illustrated in FIG. 4 is supplied from the CPU 22, then the tag of the entry specified by address YYY is XXX in the address translation table ATT illustrated in FIG. 5. Accordingly, the address management part 17b determines that the data occupying address YYY of the DRAM 14 is the correct data.

On the other hand, when the tag of the entry specified by address YYY is other than XXX (for example, XYX), the address management part 17b determines that the data stored at address YYY of the DRAM 14 corresponds to data at another address of the NAND 13.

The dirty flag DF is a flag that indicates whether the data that is in the NAND 13 and corresponds to an address of a particular entry ENT is rewritten according to the latest data of the DRAM 14 when the data in the DRAM 14 that corresponds to a particular entry ENT has been rewritten.

When the dirty flag DF indicates "0", a portion of data in the DRAM 14 is written to the NAND 13, and the data in the DRAM 14 coincides with the data in the NAND 13. When the dirty flag DF indicates "1", a portion of data in the DRAM 14 is not written to the NAND 13, and the data in the DRAM 14 does not coincide with the data in the NAND 13.

The valid flag VF indicates whether the data stored in the DRAM 14 is valid. The data of the DRAM 14 is invalid when the valid flag VF indicates "0". The data of the DRAM 14 is valid when the valid flag VF indicates "1".

The configuration of MMU 17 and the configuration of the address translation table ATT are not restricted to what are illustrated in FIG. 3 to FIG. 5, but can be changed.

In the above-mentioned configuration, the program code such as an operating system, etc., stored in the SSD 29 or HDD 30 is transmitted when the computer 21 starts up to the memory device 11 through the PCIe interface 25 or SATA interface 26, and through the south bridge 24 and the north bridge 23. The memory controller 15 stores program code in the NAND 13 and part of the program code in the DRAM 14. Moreover, MMU 17 included in the memory controller 15 updates the contents of the address translation table ATT.

The memory device 11, SSD 29, and HDD 30 are controlled in operation by the operating system of the computer 21, and the memory device 11 is recognized to be a DRAM by the CPU 22.

(Operation)

Figure 7:
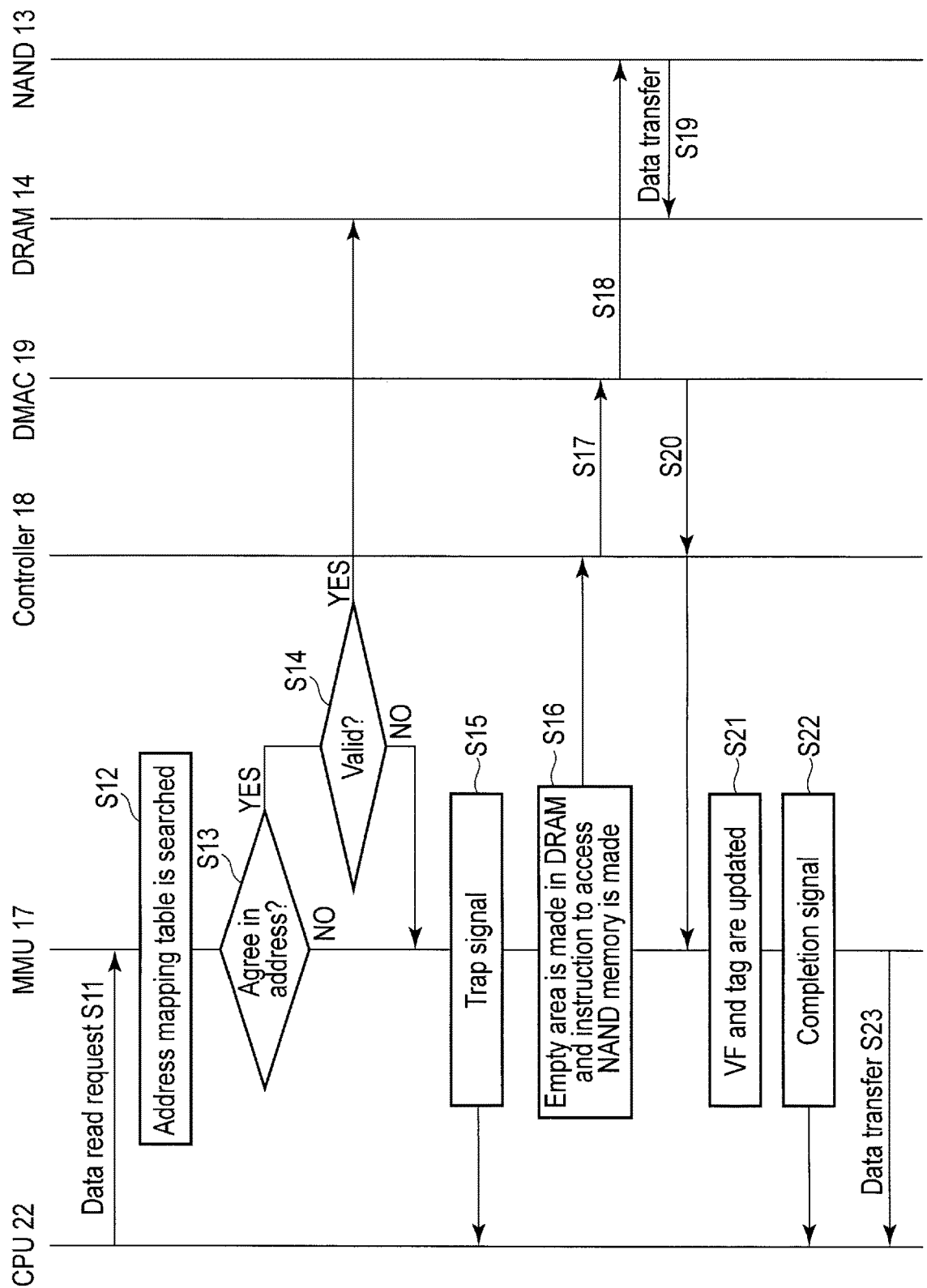
FIG. 7 is a sequence chart which illustrates how the memory device operates.

The operation of the memory device 11 having the above-mentioned composition will be explained below with reference to FIG. 7.

For example, when a data read request is issued from the CPU 22 to the memory device 11 (S11), the command analysis part 17a of MMU 17 analyzes a read command which is the read request. The address management part 17b searches the address translation table ATT based on a physical address contained in the read command (S12). That is, as described above, it is determined whether the physical address included in the read command and any one of the addresses kept in the address translation table ATT are coincident with each other (S13). When the result indicates that they are coincident with each other, it is then determined whether the valid flag VF of the address as a subject of comparison is valid (S14). When the result of the determination indicates valid, the data in the DRAM 14 is read and transmitted through the north bridge 23 to the CPU 22 (S24).

In contrast, when the determination result of S13 indicates that the addresses are not coincident with each other, or when the determination result of S14 indicates that the valid flag is invalid, the interrupt management part 17c outputs a trap signal as an interrupt signal (S15). The trap signal is supplied to the north bridge 23. Upon receipt of a trap signal, MMU 23a of the north bridge 23 will generally have access to the HDD 30 via the SATA interface or to the SSD 29 via the south bridge 24 and the PCIe interface 25. In contrast, when MMU 23a in this embodiment receives a trap signal, it does not have access to the SSD 29 or HDD 30 but notifies the CPU 22 of the receipt of the trap signal. Based on the notification, the CPU 22 brings the task, which issues the read request, into a suspension state (idle state), for example, and performs some other task.

After transmitting the trap signal, MMU 17 causes the DRAM 14 to make an empty (free) area and instructs the controller 18 to read data from the NAND 13 (S16). This data is none other than data that corresponds to the read request issued from the CPU 22. It is determined based on the dirty flag DF that whether the data in the DRAM 14 should be written to the NAND 13 when the empty area is created in the DRAM 14, as will be described later.

The controller 18 instructs the DMAC 19 to read data that is specified by the read request (S17). The DMAC 19 reads data corresponding to the read request, from the NAND 13 (S18), and transmits the data to the DRAM 14 (S19).

When the above-mentioned operation is to be performed based on the instructions of MMU 17 and when the applicable area in the DRAM 14 is not empty, the controller 18 instructs the DMAC 19 to save some data in the DRAM 14 to the NAND 13, and to make an empty area in the DRAM 14. Specifically, when the dirty flag DF of the address translation table ATT is "1", for example, the data in DRAM 14 that corresponds to this particular dirty flag is written to the NAND 13, and thus an empty area is made in the DRAM 14. When the dirty flag DF is "0", the area in the DRAM 14 that corresponds to this particular dirty flag is recognized to be an empty area which can be overwritten. Then, the controller 18 instructs the DMAC 19 to read the data corresponding to the read request, from the NAND 13, and to transmit the data to the empty area of the DRAM 14. It should be noted that how to generate an empty area is not limited to the above method, but that various methods may be applicable.

When the transmission of data from the NAND 13 to the DRAM 14 is completed, the notice of completion will be sent from the DMAC 19 to the controller 18, and the controller 18 will notify the completion of transmission to the MMU 17 (S20). When the MMU 17 receives the notification, it sets the valid flag VF to "1" in order to indicate that the area is valid and updates the tag to the value of the high order bits of the address (S21). Then, when MMU 17 receives the notification of completion, the interrupt management part 17c will transmit a completion signal to the CPU 22 (S22).

Upon receipt of the completion signal, the CPU 22 will make preparations for resuming the task which has been changed into a suspension state. Moreover, MMU 17 reads the data corresponding to the read request from the DRAM 14, and transmits it to the CPU 22 (S23).

It should be noted that the above-mentioned explanation is given to the operation of reading data from the memory device 11 according to the read request from the CPU 22. It should be also noted that, when a data write request is issued from the CPU 22, an operation that is the same as the above will be performed. Namely, in the case where a write command is issued from the CPU 22 as a write request, and the DRAM 14 does not have any physical address that is attached to the write command, the memory controller 15 will transmit a trap signal to the CPU 22 as an interrupt signal in the same way as the above. The CPU 22 which receives the trap signal brings the task which issues the write request into a suspension state, and performs some other task.

Subsequently, the data which should be written to an address is transmitted from the NAND 13 to the DRAM 14. Then, the memory controller 15 writes the data to the address of the DRAM 14. When writing is completed, a completion signal will be transmitted from the memory controller 15 to the CPU 22, and the CPU 22 will resume execution of the task which is in the suspension state. Moreover, the address management part 17b of MMU 17 sets the dirty flag DF corresponding to the write target address in the address translation table ATT as "1".

Furthermore, when neither the DRAM 14 nor the NAND 13 has an address which is an object to be accessed according to a read request or a write request from the CPU 22, MMU 23a of the north bridge 23 transmits a page fault to the CPU 22. MMU 23a of the north bridge 23 having transmitted the page fault performs swap processing which replaces the data of the memory device 11 with the data of the SSD 29 or HDD 30. For this reason, MMU 23a instructs the south bridge 24 to read from the SSD 29 or HDD 30 the data that corresponds to a read request or a write request. The south bridge 24 reads the data that corresponds to a read request or a write request, from the SSD 29 or HDD 30 through the PCIe interface 25 or SATA interface 26, and transmits the data through the north bridge 23 to the NAND 13 of the memory device 11.

Furthermore, in the above-mentioned explanation, an interrupt signal, an interrupt completion signal, and a trap signal are presented by way of mere examples. These signals can be modified to signals which the memory system 11 can notify to the CPU 12 when an event is changed in the memory system 11. The event includes that mismatch of address is detected in the memory system 11 and data transmission from the memory system 11 to the CPU 12 is completed, for example.

The embodiment is not limited to the DIMM and the embodiment can be applied to a single in-line memory module (SIMM) or another memory module.

(Advantage)

According to the embodiment, the memory device 11 has the NAND 13 and DRAM 14 which stores a part of the data stored in the NAND 13. Furthermore, the memory device 11 is recognized by the CPU 22 as a DRAM which has a storage capacity of the NAND 13. Therefore, since it can consider that the CPU 22 has a large-scale DRAM, the CPU 22 will be improved in its performance.

Moreover, the memory device 11 comprises the NAND 13 and DRAM 14 which stores a part of the data stored in the NAND 13. In the event that there is no requested data in the DRAM 14 when a data read request or a data write request has been received from the CPU 22, the memory controller 15 transmits a trap signal as an interrupt signal to the CPU 22, and reads the data that corresponds to the data read request or the data write request, from the NAND 13. Upon receipt of the trap signal, the CPU 22 is capable of bringing a task which has issued the data read request or the data write request into a suspension state, and is capable of performing another task. Therefore, the CPU 22 does not need to wait for completion of the data read request or the data write request, which makes it possible to prevent reduction in performance of the CPU 22.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory configured to store data;
   a volatile memory configured to store a part of the data stored in the nonvolatile memory, a capacity of the volatile memory being smaller than a capacity of the nonvolatile memory; and
   a controller configured to:
   in response to receiving, from a requester, a first request that includes an address,
      send, to the requester, first information as to whether first data is not stored in the volatile memory, the first data corresponding to the address included in the first request.

2. The memory system according to claim 1, wherein the controller is configured to:
   send the first information as an interrupt signal.

3. The memory system according to claim 1, wherein the controller is further configured to:
   in response to receiving the first request from the requester,
      in a case where the first data is stored in the volatile memory, send, to the requester, the first data from the volatile memory.

4. The memory system according to claim 1, wherein the controller is further configured to:
   in response to receiving the first request from the requester,
      in a case where the first data is not stored in the volatile memory,
         read the first data from the nonvolatile memory; and
         store the read first data into the volatile memory.

5. The memory system according to claim 4, wherein the controller is further configured to:
   upon the first data being stored into the volatile memory, send, to the requester, second information indicating that the first data has been stored into the volatile memory.

6. The memory system according to claim 5, wherein the controller is further configured to:
   after sending the second information to the requester, send, to the requester, the first data from the volatile memory.

7. The memory system according to claim 5, further comprising:
   a first pin and a second pin, the second pin being different from the first pin, wherein
   the first information is sent to the requester through the first pin, and
   the second information is sent to the requester through the second pin.

8. The memory system according to claim 1, wherein the controller is further configured to:
   allow the requester to recognize that the memory system has a capacity equal to the capacity of the nonvolatile memory.

9. The memory system according to claim 1, further comprising:
   a dual inline memory module (DIMM) board, wherein the nonvolatile memory, the volatile memory, and the controller are provided on the DIMM board.

10. The memory system according to claim 1, wherein the volatile memory comprises a dynamic random access memory (DRAM), and
    the nonvolatile memory comprises a flash memory.

11. A memory system comprising:
    a nonvolatile memory configured to store data;
    a volatile memory configured to store a part of the data stored in the nonvolatile memory; and
    a controller configured to:
    in response to receiving, from a requester, a first request that includes an address,
       in a case where first data is not stored in the volatile memory, the first data corresponding to the address included in the first request,
          read the first data from the nonvolatile memory;
          store the read first data into the volatile memory; and
          upon the first data being stored into the volatile memory, send, to the requester, first information indicating that the first data has been stored into the volatile memory.

12. The memory system according to claim 11, wherein the controller is further configured to:
    after sending the first information to the requester, send, to the requester, the first data from the volatile memory.

13. The memory system according to claim 11, wherein the controller is further configured to:
    in response to receiving the first request from the requester,
       in a case where the first data is stored in the volatile memory, send, to the requester, the first data from the volatile memory.

14. The memory system according to claim 11, wherein the controller is further configured to:
    before sending the first information to the requester after receiving the first request, send, to the requester, second information as to whether the first data is not stored in the volatile memory.

15. The memory system according to claim 14, wherein the controller is configured to send the second information as an interrupt signal.

16. The memory system according to claim 14, further comprising:
a first pin and a second pin, the second pin being different from the first pin, wherein
the first information is sent to the requester through the first pin, and
the second information is sent to the requester through the second pin.

17. The memory system according to claim 11, wherein
a capacity of the volatile memory is smaller than a capacity of the nonvolatile memory, and
the controller is further configured to:
allow the requester to recognize that the memory system has a capacity equal to the capacity of the nonvolatile memory.

18. The memory system according to claim 11, further comprising:
a dual inline memory module (DIMM) board, wherein
the nonvolatile memory, the volatile memory, and the controller are provided on the DIMM board.

19. The memory system according to claim 11, wherein
the volatile memory comprises a dynamic random access memory (DRAM), and
the nonvolatile memory comprises a flash memory.

20. The memory system according to claim 11, wherein
the requester is a central processing unit of an information processing device.

* * * * *